United States Patent [19]
Ferguson et al.

[11] Patent Number: 6,008,134
[45] Date of Patent: Dec. 28, 1999

[54] PROCESS FOR FORMING SEMICONDUCTOR DEVICE USING BEVELED CLAMP FINGERS IN AN ETCHING SYSTEM

[75] Inventors: Gregory S. Ferguson, Austin; Christopher M. Devany, Pflugerville, both of Tex.

[73] Assignee: Motorola, Inc., Schaumburg, Ill.

[21] Appl. No.: 08/795,433

[22] Filed: Feb. 5, 1997

[51] Int. Cl.[6] .................................................. H01L 21/461
[52] U.S. Cl. .......................... 438/716; 438/631; 438/697; 118/729
[58] Field of Search ..................................... 438/716, 697, 438/626, 631, 565; 118/728, 729

[56] References Cited

U.S. PATENT DOCUMENTS

| | | |
|---|---|---|
| 4,969,550 | 11/1990 | Van Laarhove . |
| 5,124,272 | 6/1992 | Saito et al. . |
| 5,268,067 | 12/1993 | Dostalik et al. .................. 156/643 |
| 5,316,278 | 5/1994 | Sherstinsky et al. . |

*Primary Examiner*—Caridad Everhart
*Attorney, Agent, or Firm*—Robert A. Rodriguez; George R. Meyer

[57] ABSTRACT

Beveled clamp fingers (48) are used in an etching system. The beveled top surfaces (40) of the clamp fingers allow etching species to attack more readily the layer being etched at locations near the beveled clamp fingers (48), thereby reducing the size of halo regions (622). In other embodiments, triangular clamp fingers (78) or clamp fingers (88) with rounded top surfaces can be used.

21 Claims, 3 Drawing Sheets

PROCESS FOR FORMING SEMICONDUCTOR DEVICE USING BEVELED CLAMP FINGERS IN AN ETCHING SYSTEM

FIELD OF THE INVENTION

This invention relates in general to processes for forming semiconductor devices, and more particularly, to etching processes for semiconductor devices.

BACKGROUND OF THE INVENTION

Etching systems typically have a physical mechanism, such as a clamp ring, a clamp ring with clamp fingers, and the like, to retain a wafer on a chuck during an etching step. An etching system (not fully illustrated in FIG. 1) includes a clamp ring 16 with prior art clamp fingers 18 that extend onto portions of a semiconductor device substrate 10 as shown in FIG. 1. As used in this specification, a semiconductor device substrate includes a monocrystalline semiconductor wafer, a semiconductor-on-insulator wafer, or any other substrate used to form a semiconductor device. The semiconductor device substrate 10 includes a plurality of stepping fields 12, where each stepping field 12 includes one or more semiconductor devices (not identified within FIG. 1). Each clamp finger 18 has a single top surface 20 that slopes down at an angle away from the top of the clamp ring 16 and toward the semiconductor device substrate 10 as shown in FIG. 2. The fingers also have sides 22 and a distal end 24.

When etching a layer of material, such as polysilicon, with the clamp ring 16 in place, a residual amount of the polysilicon remains on the semiconductor device substrate 10 in areas near the clamp fingers 18. The clamp fingers 18 cover a portion of the polysilicon layer during the etching step, such that the polysilicon beneath the clamp fingers is unetched. Referring to FIG. 3, a polysilicon member 30 has a covered region 32 corresponding to an area beneath a clamp finger during the etching step and halo regions 34 that are near the sides of region 32. Halo regions 34 are typically only a fraction of the covered region 32. Portions of an insulating layer 60 are exposed after the etching step.

During subsequent processing, these halo regions 34 cause processing problems. More particularly, in a logic process flow, the halo regions 34 can delaminate from the substrate 10 and cause particle problems that spread over the substrate surface. These particles can cause electrical shorts and other problems that make the devices defective.

One attempt to solve the problem is to increase the overetch time to etch away most or all the halo region. This process does not work well when the polysilicon layer lies on a gate dielectric layer because the gate dielectric layer is relatively thin. During the overetch, pin holes are formed in the gate dielectric. After the pin holes are formed, the etching species used to etch the polysilicon layer attacks the semiconductor device substrate underlying the pin holes and forms pits within the substrate. Adding overetch time also increases cycle time which is undesired.

A need exists to form a semiconductor device on a semiconductor device substrate where delamination of polysilicon or other conductive materials will not occur and cause problems. A need further exists for finding a solution to the problem without having to add processing steps or use unusual or exotic materials.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

Beveled clamp fingers are used in an etching system. The beveled top surfaces of the clamp fingers allow etching species to attack more readily the layer being etched at locations near the beveled clamp fingers. This reduces the size of the halo regions. In other embodiments, triangular clamp fingers or clamp fingers with rounded top surfaces can be used. The present invention is better understood with the description of the embodiments that follow.

Figure 1:
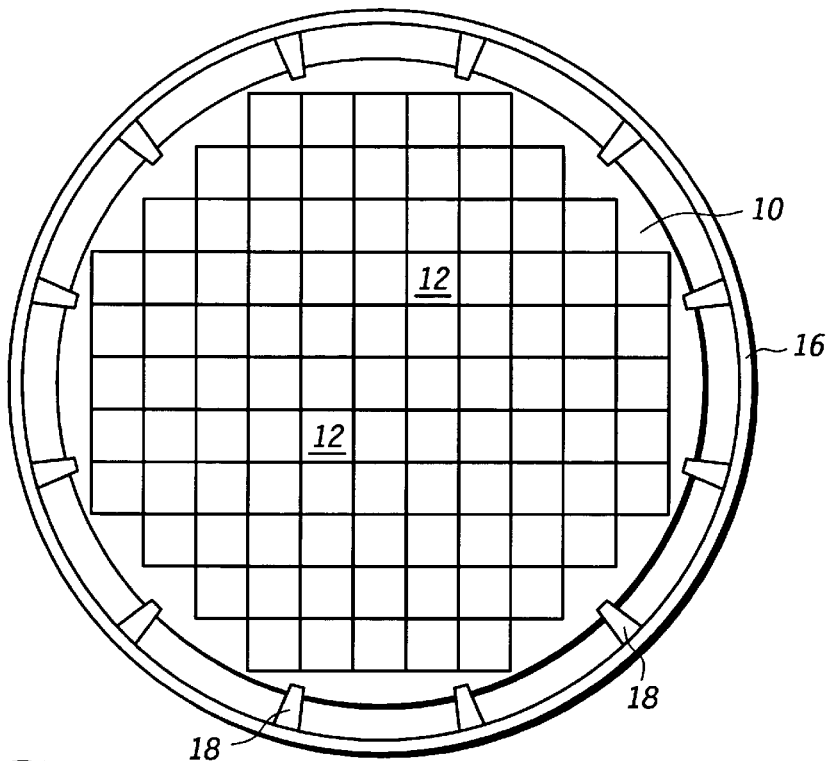
FIG. 1 includes an illustration of a top view of a prior art clamp ring and semiconductor device substrate.
Figure 2:
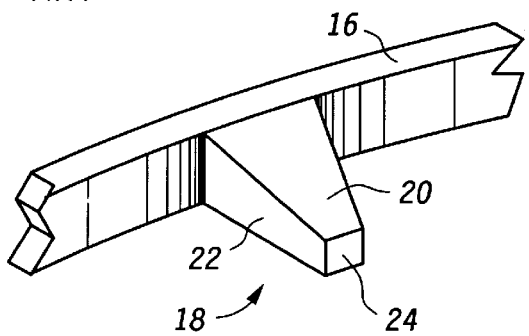
FIG. 2 includes an illustration of a perspective view of the clamp ring and clamp finger as illustrated in FIG. 1.
Figure 3:
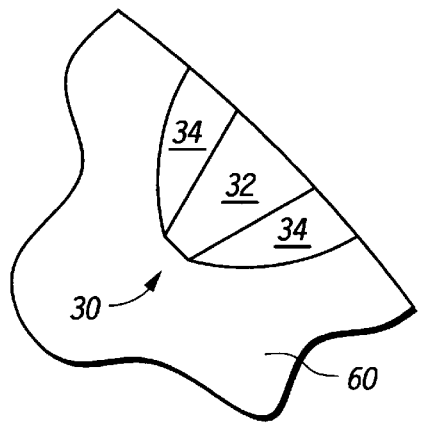
FIG. 3 includes an illustration of a top view of a portion of a semiconductor substrate illustrating the formation of halo regions near a covered region of a conductive member.
Figure 4:
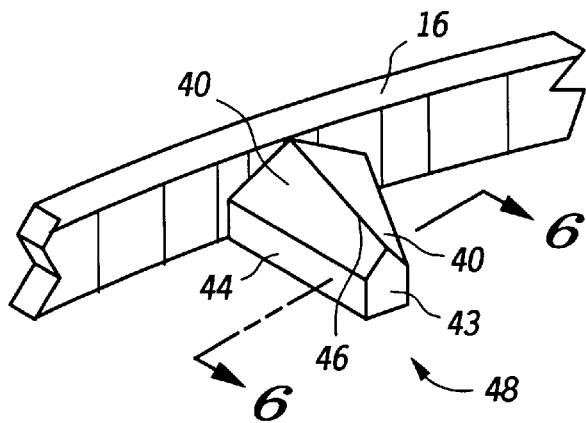
FIG. 4 includes an illustration of a perspective view of a beveled clamp finger in accordance of an embodiment of the present invention.

FIG. 4 includes an illustration of a perspective view of a clamp ring 16 and a beveled clamp finger 48 that includes a plurality of top surfaces 40. The clamp finger 48 also has sides 44 (of which only one is shown) and a distal end 43. The proximal end of the clamp finger 48 is attached to the clamp ring 16. The beveled clamp finger 48 comprises a material including an organic polymer. In one embodiment, the clamp finger 48 comprises an aramid resin, such as Vespel, which is made by E. I. DuPont de Nemours & Company of Wilmington, Del. In this particular embodiment, a ridge line 46 lies between and separates the two top surfaces 40. The ridge line 46 extend along the entire length and center of the top of the clamp finger 48. In other embodiments, more than one ridge line can be used. In one embodiment (not illustrated), two ridge lines extend from the clamp ring 16 and intersect at the distal end 43 of the clamp finger 18. In this particular embodiment, there would be three top surfaces: two beveled top surfaces and a relatively flat top surface.

The maximum height of the beveled clamp finger 48 at the distal end 43 is approximately two millimeters, wherein the height is measured perpendicular from a bottom surface of the clamp finger 48. Beveled clamp finger 48 has a maximum height of approximately 2.6 millimeters at the distal end and approximately four millimeters at a location at the edge of the substrate device substrate 10 (not shown in FIG. 4). The height continues to increase to about four millimeters at the proximal end of the finger 48 near the clamp ring 16. The width of the finger 48 at the distal end is approximately 1.3 millimeters. Unlike the prior art, the height of the sides 44 is approximately 1.0 millimeters, and is substantially uniform along the entire length of the clamp finger 48. In other embodiments, the sides are not limited to a height of 1.0 millimeters. Still, the height of the sides 44 should not be as high as the ridge line 46.

Figure 5:
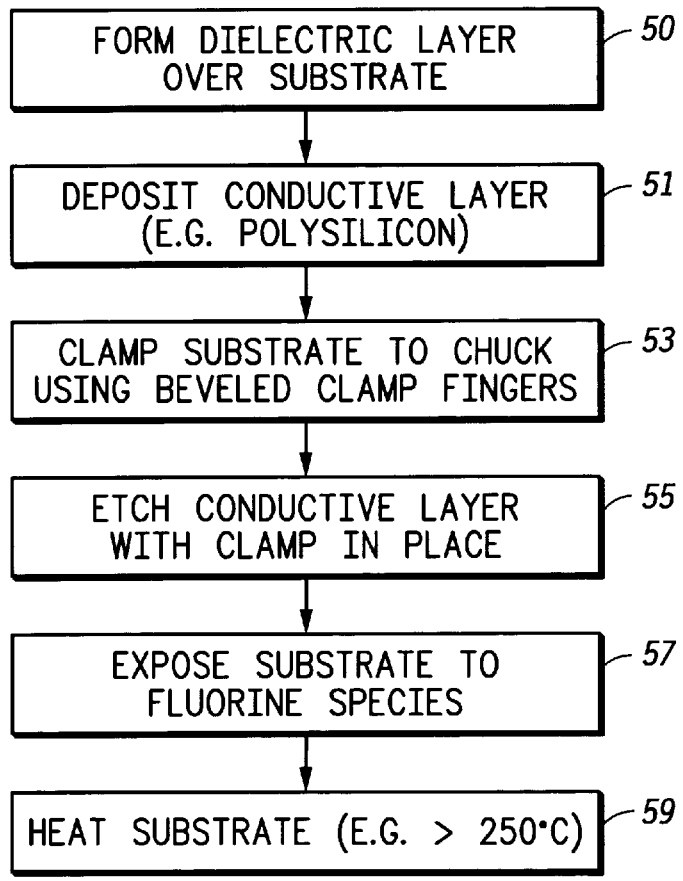
FIG. 5 includes a process flow diagram using the beveled clamp finger in accordance with an embodiment of the present invention.

FIG. 5 includes a process flow diagram for forming a semiconductor device using the beveled clamp fingers 48. It will be helpful to refer to FIG. 6 in conjunction with portions of the process flow of FIG. 5. A dielectric layer 60 is formed over the semiconductor device substrate 10 in step 50. Dielectric layer 60 includes field isolation regions and gate dielectric portions. Near the edge of the substrate 10, the dielectric layer 60 has a thickness of approximately 0.3–0.8 microns. Next, a conductive layer 62 is formed over the dielectric layer in step 51. The conductive layer can include silicon (polycrystalline or amorphous), a silicide, a metal or other conductive material. A resist layer is coated over conductive layer and is patterned. The substrate 10 with the patterned resist layer is then placed into an etching system and is clamped to a chuck within the etching system using the beveled clamp fingers 48 in step 53.

After the substrate 10 is clamped, the conductive layer 62 is etched in step 55 using the patterned resist layer as an etching mask. Near the edge of the semiconductor device substrate 10, virtually no resist lies where the clamp fingers touch the conductive layer because an edge bead removal step during the coating step removed resist from approximately five millimeters from the edge of the semiconductor device substrate 10. The etch of the conductive layer proceeds in a conventional manner using typical etching parameters. In the case of silicon, the etching species includes a halogen, such as fluorine, chlorine, and bromine, and in the case of aluminum, the etching species includes chlorine.

Figure 6:
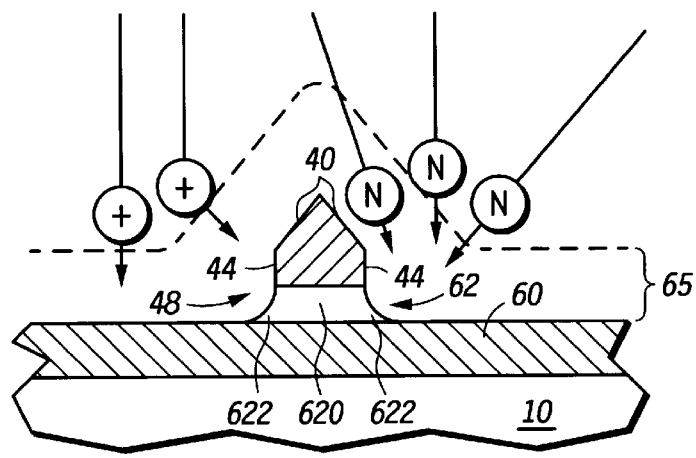
FIG. 6 includes an illustration of a cross-sectional view of a portion a semiconductor device substrate and the clamp finger in FIG. 5 illustrating an etching species approaching a semiconductor device substrate.

FIG. 6 includes an illustration of cross-section view of the clamp finger 48 and semiconductor device substrate 10 at a distance from the distal end 43 near the end of the etching step. The conductive layer 62 includes a covered region 620 and halo regions 622 near the opposite sides of the covered region 620. The thickness of the halo regions is typically no more than approximately 500 angstroms or approximately 0.2 times the thickness of the covered region 620. The halo regions 622 extend approximately 100–2000 microns from the edges of the covered region 620.

Two different types of etching species approach the substrate: ionized species and neutral etching species. The ionic species are illustrated with "+"s, and the neutral etching species, which are not charged, are illustrated by circled "n"s. The neutral species are essentially unaffected by electrical fields. By having the two top surfaces 40, beveled clamp finger 48 allows neutral species to attack the conductive layer 62 from a plurality of directions including those that pass over the clamp finger 48.

As a result of the plasma created above the substrate surface, an electrical boundary layer 65 is formed near the surface of the substrate and clamp finger 48 as illustrated in FIG. 6. This boundary layer 65 is at a location where the electrical field is relatively high. The electrical field within the boundary layer 65 accelerates the positive ions traveling towards the clamp finger 48 and semiconductor device substrate 10.

When the ionic species reach the boundary layer 65, the ionic species travel normal to the boundary layer 65 at that point. By beveling the top of the clamp finger 48, some of the ionic species is redirected near the conductive layer 62 near the bottom of the clamp finger 48. The redirected ionic species help to reduce the thickness in the halo regions 622 near the clamp finger 48.

The amount of overetch used for the particular process varies depending on the etching system used and the thickness of the conductive layer 62. When comparing the prior art clamp fingers 18 and the beveled clamp fingers 48 at a constant overetch time, the halo regions are smaller for the beveled clamp fingers 48. If the size of halo regions are held constant, the amount of overetch used with clamp fingers 48 should be approximately twenty seconds less than it would be if the prior art clamp fingers 18 are used. The reduced overetch decreases the amount of erosion of the dielectric layer 60. For a gate dielectric, there should be a lower probability of forming a pin hole through the gate dielectric during the conductive layer 62 etch. Therefore, an advantage can be seen by using the beveled clamp fingers 48 because it allows the use of less overetch while obtaining a halo region of constant area.

Should the halo regions be too large, the overetch can further be extended, but an etching process using clamp fingers 48 erodes less of a gate dielectric layer compared to using the prior art clamp fingers 18 because the neutral etching species can reach portions of the conductive layer 62 near the clamp finger 48 from more directions and the ionic species are less likely to be attracted to finger 48 when traveling perpendicular to the substrate surface. After the etch, the substrate 10 is removed from the etching system, and the patterned resist layer is removed from the substrate 10.

The substrate is exposed to fluorine species in step 57. In one embodiment, the fluorine species can be introduced during a P+ source/drain implant using $BF_2$ as the implanting species. In another embodiment, the fluorine species is introduced during subsequent etching steps including oxide etches or planarizing etchback processes. For a planarizing etchback process, an interlevel dielectric layer is deposited over the unetched portion of the conductive layer 62. A planarizing polymer (i.e., resist, polyimide, spin-on glass, etc.) is coated over the interlevel dielectric layer. The planarizing polymer and interlevel dielectric layer are planarized during an etchback step that etches the polymer and interlevel dielectric layer at about the same etch rate. 21. After planarizing, the interlevel dielectric layer can have a thickness of less than 5000 angstroms as measured above the halo region. The significance of the planarizing etchback process is discussed in more detail below.

In still another embodiment, the fluorine is introduced into the substrate during a deposition step. More specifically, fluorine species can be used to clean residual oxide or other materials within a deposition chamber after substrates are removed. The fluorine removes the residual oxide that remains on the surfaces of a susceptor (that may include a heater block) and a shower head for the deposition system. The fluorine that is trapped within the susceptor or within the shower head is released and introduced into the next substrates which are placed within the deposition system.

After a fluorine species is introduced by any one or more of the processes described above, heat is applied to the substrate in step 59. This heat is typically at a temperature of at least 200 degrees Celsius and is usually at a temperature of at least 250 degrees Celsius. The combination of the fluorine species and the heat is believed to affect the interface between the conductive layer 62 and the dielectric layer 60 on the substrate 10 and may cause delamination to occur. Referring to the planarization etchback process, portions of the interlevel dielectric layer and the halo regions formed using the prior art clamp fingers 18 can delaminate during this heating step and can pop or explode, thereby spreading particles over the exposed surfaces of the substrate. The likelihood of this occurring is reduced when using the clamp fingers 48 because the halo regions are smaller for a constant overetch time when etching the conductive layer 62. Therefore, by using the present invention clamp fingers 48, the likelihood of delamination can be reduced.

Although not fully understood, the likelihood of delamination and particle generation is believed to be a function of the thickness of the halo regions 622. When the halo regions 622 are very thin or as thick as the covered region 624, the particle problems are not generally seen. However, at an intermediate thickness (the limits of which are unknown), the particle problems are typically experienced during a heated pump down cycle before depositing subsequent metal layer that could be used for interconnects.

Processing of the substrate continues until a substantially completed device has been formed. In a substantially completed device, insulating layers, interconnect levels, and a passivation layer are typically formed over the conductive layer 62 after it has been etched as illustrated in FIG. 6. The processes used to form these layers are conventional.

Other shapes of clamp fingers, when seen from a cross-sectional view, are possible. From an etching standpoint, the halo regions will be smaller when the clamp fingers have a lower profile (small height). However, such a clamp finger may not have adequate mechanical integrity or will be etched too much during repeated etching cycles. The clamp finger should be designed to withstand the rigors of standard etching conditions for about a year.

Figure 7:
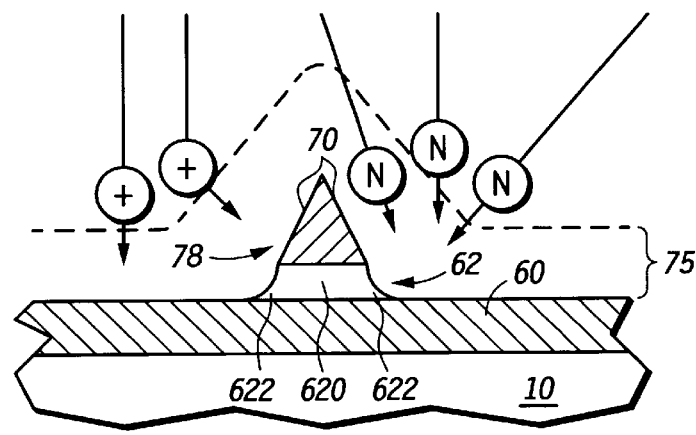
FIGS. 7 and 8 include illustrations of cross-sectional views of alternate embodiments of the present invention.
Figure 8:
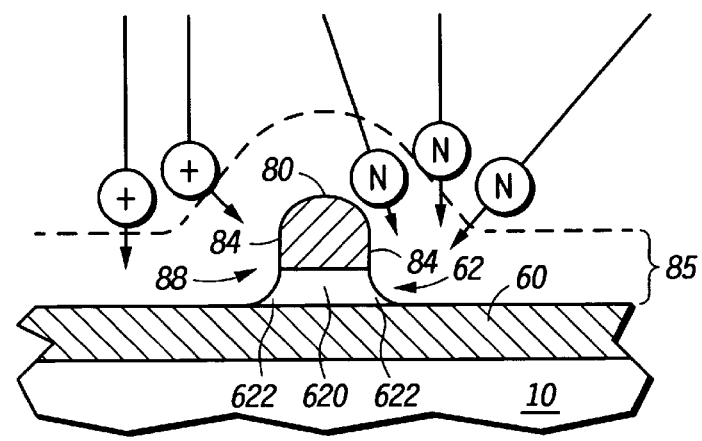

A couple of different clamp finger designs are illustrated in FIGS. 7 and 8. A clamp finger 78 generally has a pair of top surfaces 70 and a bottom surface, and forms an isosceles triangle to give a boundary layer 75, as shown in FIG. 7. In still another embodiment, a domed clamp finger 88 having a rounded top surface 80 and sides 84 is used, as shown in FIG. 8. In this instance there is one top surface 80 but it is curved to form a rounded top surface for the clamp finger. The substrate and domed clamp finger 88 produce a boundary layer 88 that is more rounded over the rounded top surface 80 compared to the other clamp fingers. Many other types of shapes are possible but are not illustrated. For example, a clamp ring finger could be in the shape of half of an oval, half of most any type of polygon other than a rectangle can be used. The polygons can be shaped as heptagons, decagons, dodecagons, etc. Clearly, other different shapes are possible but generally have a top surface where the height between the bottom surface and the top surface near a side of the clamp finger is shorter than the height between the same top surface and a location nearer the midpoint of bottom surface.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

We claim:

1. A process for forming a semiconductor device comprising the steps of:
   placing a semiconductor device substrate on a chuck of an etch system, wherein a first layer overlies the semiconductor device substrate;
   clamping the semiconductor device substrate onto the chuck using a clamp ring, wherein:
      the clamp ring has a clamp finger in contact with a portion of the first layer;
      the clamp finger has a bottom surface having opposing edges and a midpoint between the opposing edges, a top surface, and a distal end spaced apart from the clamp ring;
      at a distance from the distal end, the clamp finger has a cross section that overlies the portion of first layer;
      the clamp finger at the cross section has a first height and a second height;
      the first height is measured between the bottom surface near the midpoint of the bottom surface and top surface; and
      the second height is measured between the bottom surface near one of the opposing edges and the top surface, wherein the second height is shorter than the first height; and
   etching the first layer while the clamp ring is clamping the semiconductor device substrate onto the chuck.

2. The process of claim 1, wherein the step of clamping comprises a step of clamping the semiconductor device substrate onto the chuck using a clamp ring, wherein the cross section of the clamp finger has a shape of a polygon other than a rectangle.

3. The process of claim 1 wherein the step of clamping comprises a step of clamping the substrate onto the chuck using a clamp ring, wherein the cross section of the clamp finger has a rounded top surface.

4. The process of claim 1, further comprising a step of forming the first layer over the semiconductor device substrate, wherein the first layer comprises a conductive layer.

5. The process of claim 1, further comprising steps of:
   forming a gate dielectric layer over the semiconductor device substrate; and
   forming the first layer over the gate dielectric layer, wherein the first layer comprises a conductive layer.

6. The process of claim 1, wherein the step of etching comprises reactive ion etching.

7. The process of claim 1, further comprising steps of:
   forming an interlevel dielectric layer over the first layer after the step of etching;
   forming a polymer over the interlevel dielectric layer; and
   planarizing the polymer and the interlevel dielectric layer using an etchback step.

8. The process of claim 7, wherein the step of planarizing results in a thickness of the interlevel dielectric layer of less than 5000 angstroms as measured above first layer.

9. A process for forming a semiconductor device comprising the steps of:
   placing a semiconductor device substrate on a chuck of an etch system, wherein a first layer overlies the semiconductor device substrate;
   clamping the semiconductor device substrate onto the chuck using a clamp ring, wherein:
      the clamp ring has a clamp finger in contact with a portion of the first layer;
      at a distance from a distal end of the clamp finger, the clamp finger has:
         a bottom surface having a first edge and a second edge that is opposite the first edge;
         a first top surface lying near the distal end and the first edge of the bottom surface; and
         a second top surface lying near the distal end and the second edge of the bottom surface, wherein the first and second top surfaces are different top surfaces; and etching the first layer while the clamp ring is clamping the semiconductor device substrate onto the chuck.

10. The process of claim 9, wherein the step of clamping comprises a step of clamping the semiconductor device substrate onto the chuck using a clamp ring, wherein a distance from a distal end, the clamp finger has a cross-sectional shape over the semiconductor device substrate that is a polygon other than a rectangle.

11. The process of claim 9, wherein the step of clamping comprises a step of clamping the semiconductor device substrate onto the chuck using a clamp ring, wherein the first and second top surfaces meet at a ridge line.

12. The process of claim 9, wherein the step of clamping comprises a step of clamping the semiconductor device substrate onto the chuck using a clamp ring, wherein the clamp finger further comprises a third top surface and a plurality of ridge lines near edges of the third top surface.

13. The process of claim 9, wherein the step of clamping comprises a step of clamping the semiconductor device substrate onto the chuck using a clamp ring, wherein:

the clamp finger has a proximal end and a distal end; and a height of the clamp finger at the distal end is less than a height of the clamp finger at the proximal end.

14. The process of claim 9, further comprising steps of:

forming a gate dielectric layer over the semiconductor device substrate; and forming the first layer over the gate dielectric layer, wherein the first layer comprises a conductive silicon-containing layer.

15. The process of claim 9, wherein the step of etching comprises reactive ion etching.

16. A process for forming a semiconductor device comprising the steps of:

forming a gate dielectric layer over a semiconductor device substrate;

forming a conductive layer over the gate dielectric layer;

clamping the semiconductor device substrate onto a chuck using a clamp ring, wherein:

the clamp ring has a clamp finger in contact with a portion of the conductive layer;

at a first distance from a distal end of the clamp finger, the clamp finger has:

a bottom surface having a first edge and a second edge that is opposite the first edge;

a first top surface lying near the distal end and the first edge of the bottom surface; and a second top surface lying near the distal end and the second edge of the bottom surface, wherein the first and second top surfaces are different top surfaces;

etching the conductive layer while the clamp ring is clamping the semiconductor device substrate onto the chuck, wherein:

a portion of the conductive layer is unetched;

the portion includes a covered region and a halo region, wherein the covered region is covered by the clamp finger during this step and a halo region that lies beside the covered region, and a thickness of the halo region is a fraction of the thickness of the covered region;

exposing the semiconductor device substrate to a fluorine-containing species after the step of etching; and heating the semiconductor device substrate after the step of exposing.

17. The process of claim 16, wherein the step forming the conductive layer comprising a step of depositing a silicon layer.

18. The process of claim 16, wherein the step of etching comprises a step of etching, wherein the halo region has a thickness no thicker than 500 angstroms.

19. The process of claim 16, wherein the step of exposing comprises implanting $BF_2$ into the semiconductor device substrate.

20. The process of claim 16, further comprising steps of:

forming an interlevel dielectric layer over the conductive layer after the step of etching;

forming a polymer over the interlevel dielectric layer; and planarizing the polymer and the interlevel dielectric layer using an etchback step.

21. The process of claim 20, wherein after the steps of heating and planarizing, the interlevel dielectric layer has a thickness of less than 5000 angstroms as measured above the halo region.

* * * * *